(12) United States Patent
Laslo et al.

(10) Patent No.: US 12,300,340 B2
(45) Date of Patent: May 13, 2025

(54) ADJUSTING MEMORY POWER CONSUMPTION

(71) Applicant: Microsoft Technology Licensing, LLC, Redmond, WA (US)

(72) Inventors: Ori Laslo, Rehovot (IL); Gilad Kirshenboim, Petach Tiqva (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 260 days.

(21) Appl. No.: 18/055,566

(22) Filed: Nov. 15, 2022

(65) Prior Publication Data

US 2024/0161852 A1 May 16, 2024

(51) Int. Cl.
*G11C 29/42* (2006.01)
*G11C 11/406* (2006.01)
*G11C 29/12* (2006.01)

(52) U.S. Cl.
CPC ........ *G11C 29/42* (2013.01); *G11C 11/40615* (2013.01); *G11C 29/12005* (2013.01)

(58) Field of Classification Search
CPC ............. G11C 29/42; G11C 11/40615; G11C 29/12005; G11C 5/14; G11C 11/406; G11C 16/30; G11C 29/02; G11C 29/028; G11C 29/021
USPC ................................................. 365/185.09
See application file for complete search history.

(56) References Cited

U.S. PATENT DOCUMENTS

| | | | |
|---|---|---|---|
| 7,526,713 B2 | 4/2009 | Klein | |
| 9,698,827 B2 | 7/2017 | Kim | |
| 10,496,473 B2 | 12/2019 | Das et al. | |
| 10,725,856 B2 | 7/2020 | Ivanov | |
| 10,896,092 B2 | 1/2021 | Cadloni et al. | |
| 11,144,386 B2 | 10/2021 | Chang et al. | |
| 2015/0348600 A1 | 12/2015 | Bhatia | |
| 2016/0358075 A1* | 12/2016 | Zhang | G06N 3/063 |
| 2022/0051744 A1* | 2/2022 | Huang | G11C 29/4401 |
| 2023/0012648 A1* | 1/2023 | Fitzpatrick | A63B 24/0075 |
| 2024/0029811 A1* | 1/2024 | Prabhat | G11C 29/50016 |

FOREIGN PATENT DOCUMENTS

| | | |
|---|---|---|
| JP | 6986369 B2 | 12/2021 |
| KR | 0159183 B1 * | 2/1999 |
| KR | 20200124504 A | 11/2020 |

OTHER PUBLICATIONS

Hirano et al. (Year: 1999).*
International Search Report and Written Opinion received for PCT Application No. PCT/US23/033805, Apr. 15, 2024, 20 pages.
Invitation to Pay Additional Fees received for PCT Application No. PCT/US2023/033805, mailed on Feb. 22, 2024, 13 pages.

(Continued)

*Primary Examiner* — Fernando Hidalgo

(74) *Attorney, Agent, or Firm* — Holzer Patel Drennan

(57) ABSTRACT

A memory system may monitor a bit error rate in data read from a memory in the memory system. The memory system may determine that the monitored bit error rate satisfies an acceptable memory error condition. The memory system may adjust operation of the memory system to decrease the power consumption of the memory system, wherein the adjusted operation results in a new bit error rate monitored from data read from the memory that satisfies the acceptable memory error condition.

20 Claims, 7 Drawing Sheets

(56) References Cited

OTHER PUBLICATIONS

"DDR3 Dram with ECC", Retrieved from: https://www.digikey.cn/zh/ptm/i/issi/ddr3-dram-with-ecc/tutorial, Oct. 6, 2016, 1 Page.

"Understanding DDR", Retrieved from: https://web.archive.org/web/20210805132422/https:/www.truechip.net/articles-details/understanding-ddr/440552344, Aug. 5, 2021, 8 Pages.

"Why DDR5 is the Industry's Powerful Next-gen Memory?", Retrieved from: https://news.skhynix.com/why-ddr5-is-the-industrys-powerful-next-gen-memory/, Apr. 2, 2020, 6 Pages.

Bingham, Dan, "The Advantage of Error Correcting Code (ECC) Dram in Smartphones", Retrieved from: https://in.micron.com/about/blog/2017/february/the-advantage-of-ecc-dram-in-smartphones, Feb. 15, 2017, 3 Pages.

Patel, et al., "Understanding and Modeling On-Die Error Correction in Modern DRAM: An Experimental Study Using Real Devices", In Proceedings of 49th Annual IEEE/IFIP International Conference on Dependable Systems and Networks, Jun. 24, 2019, pp. 13-25.

Sankaranarayanan, Vadhiraj, "Error Correction Code (ECC) in DDR Memories", Retrieved from: https://web.archive.org/web/20210122165456/https:/www.synopsys.com/designware-ip/technical-bulletin/error-correction-code-ddr.html, Jan. 22, 2021, 8 Pages.

\* cited by examiner

ADJUSTING MEMORY POWER CONSUMPTION

BACKGROUND

Memory systems are typically designed to be reliable so that a user can have confidence in the accuracy of the data stored in and read from memory. Memory systems also consume electrical power to store, secure, and provide access to data stored in such memory.

SUMMARY

The described technology adjusts power consumption in a memory system, including: monitoring a bit error rate in data read from a memory in the memory system; determining that the monitored bit error rate satisfies an acceptable memory error condition; and adjusting operation of the memory system to decrease the power consumption of the memory system, wherein the adjusted operation results in a new bit error rate monitored from data read from the memory that satisfies the acceptable memory error condition.

In some aspects, the techniques described herein relate to a memory system including: a bit error rate monitor configured to monitor a bit error rate in data read from a memory in the memory system; a bit error rate tester configured to determine that the monitored bit error rate satisfies an acceptable memory error condition; and a memory operation controller configured to adjust operation of the memory system to decrease power consumption of the memory system, wherein the adjusted operation results in a new bit error rate monitored from data read from the memory that satisfies the acceptable memory error condition according to the bit error rate tester.

In some aspects, the techniques described herein relate to one or more tangible processor-readable storage media devices encoding processor-executable instructions for executing on an electronic computing device a process of adjusting power consumption in a memory system, the process including: monitoring a bit error rate in data read from a memory in the memory system; determining that the monitored bit error rate satisfies an acceptable memory error condition; adjusting operation of the memory system to decrease the power consumption of the memory system, wherein the adjusted operation results in a new bit error rate from data read from the memory system; re-monitoring the new bit error rate in data read from a memory in the memory system, responsive to the adjusting operation; and confirming that the monitored new bit error rate satisfies the acceptable memory error condition, responsive to the re-monitoring operation.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

In at least one implementation of the described technology, a memory operation adjuster adjusts operation of a memory system based on a monitored bit error rate (BER) experienced by the memory system. Generally, the term "bit error rate" refers to the number of bit errors per unit of time, such as the number of received bits of a data stream over a communication channel (such as a memory bus between memory and a memory controller) that have been altered from their correct value, such as due to noise, interference, distortion, and bit synchronization errors. In some scenarios, the memory operation adjuster adjusts operation of the memory system in a manner that increases BER with an acceptable range to decrease power consumption of a memory system. In this manner, the described technology provides a technical benefit of relaxing memory operational parameters to decrease power consumption while maintaining an acceptable BER (e.g., an acceptable BER for a current application, such as artificial intelligence computations that may have a higher acceptable BER threshold than other computations, such as executable instruction code storage).

In other scenarios, the memory operation adjuster adjusts operation of the memory system in a manner that decreases the BER of the memory system to an acceptable range, even as it increases power consumption. In these scenarios, however, the described technology provides some guidance to allow the memory operation adjuster to balance its power consumption with the BER by adjusting the memory operation just enough to satisfy an acceptable memory error condition. In other words, if a memory system is exhibiting unacceptable BER for an application, the memory operation adjuster can adjust memory operation in such a way as to increase power consumption just enough to provide an acceptable BER.

In one aspect, some implementations of the described technology may be seen as optimizing between power consumption and BER in a memory system. Acceptable BER can vary among different applications of the memory system. As such, the memory operation adjuster can adjust the memory operations of the memory system to optimize power consumption while maintaining acceptable BER for a particular application.

Figure 1:
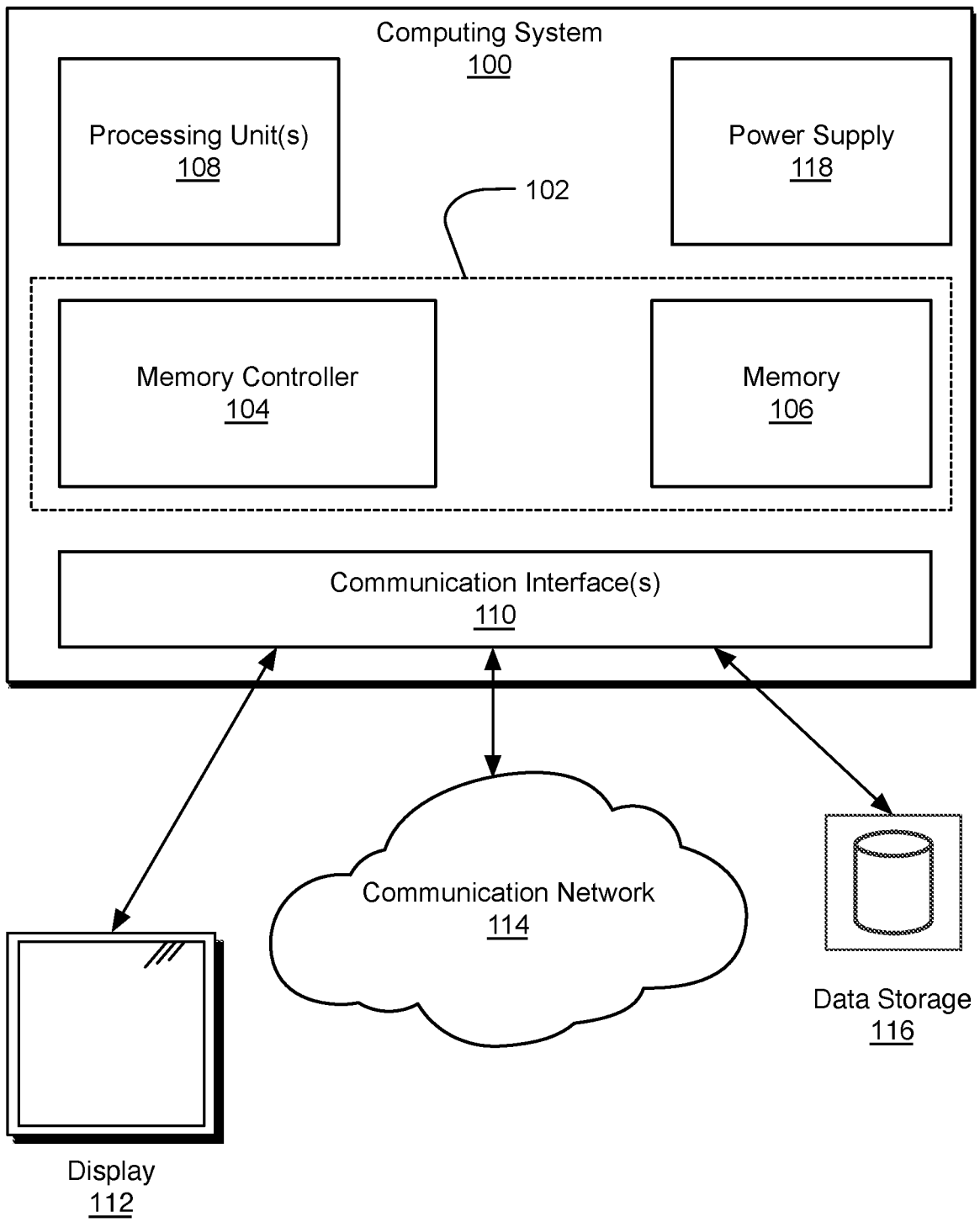
FIG. 1 illustrates a computing system that includes an example memory system capable of balancing power consumption with an acceptable bit error rate (BER).

FIG. 1 illustrates a computing system 100 that includes an example memory system 102 capable of balancing power consumption with an acceptable bit error rate (BER). The memory system 102 includes at least one memory controller 104 and at least one memory 106 (e.g., a memory chip, a memory component in a system-on-a-chip (SOC), other internal and external memory devices) for accessing data, such as storing data to the memory 106 and reading data from the memory 106. Typically, data is communicated to and from the memory 106 via the memory controller 104, which can perform many functions as part of this data path. Example functions may include without limitation data read/write functionality with the memory; communications of such data with other components in the computing system 100, including one or more processing units 108, one or more communication interfaces 110, the operating system, applications, internal data storage, and I/O ports; data encoding/decoding; data compression/decompression; data encryption/decryption; and adjusting operational parameters (e.g., refresh rate, supply voltage level, memory interface drive current) of the memory system 102. The processing units 108 execute software programs in the computing system 100, such as artificial intelligence applications, database applications, productivity applications, etc.

The computing system 100 may communicate with other entities, including without limitation a display 112, a communication network 114, and external data storage 116. In some implementations, operational aspects of the memory controller 104 and the memory 106 can be controlled or influenced by the user, such as through configuration files, a user interface presented via the display 112, and other means.

The computing system 100 also includes a power supply 118, which provides power to various components of the computing system 100. In particular, the power supply 118 supplies power to the memory system 102. For example, in one implementation, the power supply 118 provides power to both the memory controller 104 and the memory 106.

The memory controller 104 can adjust the operation of the memory system 102 in such a way as to manage power consumption by the memory 106. If the application (e.g., an artificial intelligence operation) that is accessing the memory 106 can tolerate a higher BER, the memory controller 104 may adjust the operation of the memory system 102 to reduce the power consumption of the memory 106, typically at the cost of a higher BER. As long as the higher BER is acceptable to the application, the memory system 102 can be operated at reduced power consumption. In contrast, if the application requires (or specifies) a lower BER than is currently exhibited by the memory 106, the memory controller 104 can increase the power consumption of the memory 106 in an effort to decrease the BER to an acceptable level for the application. In this manner, the described technology provides one or more technical benefits of balancing the power consumption of the memory 106 with the BER needs of an application that accesses the memory 106.

Figure 2:
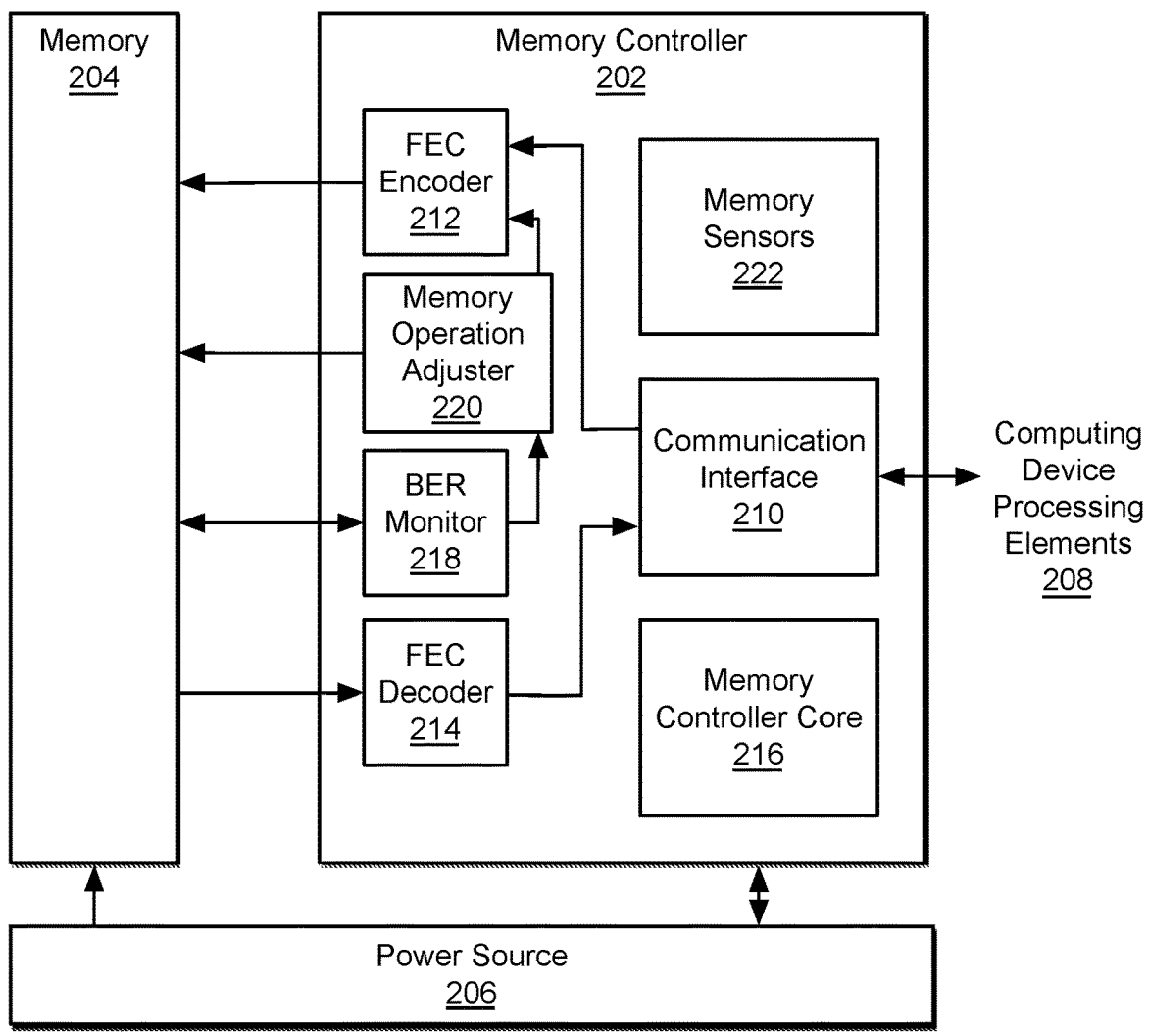
FIG. 2 illustrates example components of a memory system that balances power consumption with an acceptable bit error rate (BER).

FIG. 2 illustrates example components of a memory system 200 that balances power consumption with an acceptable bit error rate (BER). The memory system 200 includes a memory controller 202, a memory 204, and a power source 206 (e.g., a power supply), which supplies power to one or both of the memory controller 202 and the memory 204. It should be understood that the memory 204 may itself include multiple memory arrays, memory cores, memory chips, etc. The power source 206 may or may not be considered part of the memory system 200—in most cases, the power source 206 is separate from or external to the memory system 200. The memory controller 202 is configured to adjust operation of the memory system 200 to balance power consumption with BER.

In the illustrated implementation, the memory controller 202 receives memory write data from computing device processing elements 208 and sends read data to the computing device processing elements 208 via a communication interface 210. The write data is received through the communication interface 210 by a forward error correction (FEC) encoder (FEC encoder 212), and the encoded write data is then written into the memory 204 by the memory controller 202. The read data is received from the memory 204 by an FEC decoder 214, and the decoded read data is sent through the communication interface 210 to the computing device processing elements 208 by the memory controller 202. Some operations of the memory controller 202 may be performed by a memory controller core 216, which may include one or more processors and/or memory.

In at least one implementation, the memory controller 202 includes a BER monitor 218 that monitors the BER of data read from the memory 204. The BER monitor 218 passes the monitored BER to a memory operation adjuster 220, which evaluates the BER in the context of the application accessing the memory 204 and/or physical operating parameters (e.g., temperature, vibration, semiconductor manufacturing process variations) of the memory system 200. Some applications are more BER tolerant than others, and/or some physical operating parameters make the memory more susceptible to BER problems than others. Accordingly, based on one or more of these factors, the memory operation adjuster 220 can adjust the operation of the memory system 200 to increase/decrease the BER, often with a corresponding effect of decreasing/increasing the power consumption of the memory system 200. In some implementations, the memory operation adjuster 220 of the memory controller 202 communicates with the power source 206 to adjust the operation of the memory system 200, such as to adjust the voltage level supplied to the memory 204.

Decisions by the memory operation adjuster 220 relating to adjusting memory operation are informed by an acceptable memory error condition that specifies a threshold or range of BER that is acceptable for a given application accessing the memory 204 and/or the current physical operating parameters (collectively referred to as the memory context), the latter of which can be determined by memory sensors 222, for example. The memory operation adjuster 220 can extract the acceptable memory error condition from acceptable BER parameters stored in memory or storage that is accessible by the memory controller 202. In addition, the memory operation adjuster 220 may perform some computations on such parameters, such as weighting and/or combining different parameters, to yield an acceptable memory error condition for the current memory access scenario. For example, a given application may specify an acceptable memory error range as a base value and then bias the base value according to the current operating temperature of the memory system.

In one implementation, the memory operation adjuster 220 monitors the BER from the memory 204, determines an acceptable memory error condition based on the application currently accessing the memory 204 and/or the current physical operating parameters, and determines whether the monitored BER satisfies the acceptable memory error condition. If so, the memory operation adjuster 220 can determine whether the monitored BER can be increased while still satisfying the acceptable memory error condition (e.g., the monitored BER satisfies the acceptable memory error condition with some buffer or "room to spare"). If so, the memory operation adjuster 220 may adjust the operation of the memory system 200 to decrease the power consumption of the memory system while maintaining an acceptable BER for the current memory context. If the monitored BER does not have sufficient buffer within the acceptable memory error condition, then the memory operation adjuster 220 may leave the memory operation unchanged for the current memory context, although it may alternatively adjust the memory operation to create more buffer.

If the monitored BER does not satisfy the acceptable memory error condition, then the memory operation adjuster 220 may adjust memory operation to decrease the BER, even though this may increase power consumption. Nevertheless, the described technology provides the opportunity to decrease the BER/increase power consumption with some fine-grained control—the memory operation adjuster 220 can adjust memory operation to decrease the BER to the point of satisfying the acceptable memory error condition (e.g., with buffer, if desired), rather than simply maxing out the power consumption in the blind hope that it achieves an acceptable BER.

The technology described in FIG. 2 provides one or more technical benefits of multiple operating aspects that can be adjusted to balance power consumption with a BER that satisfies an acceptable memory error condition.

Figure 3:
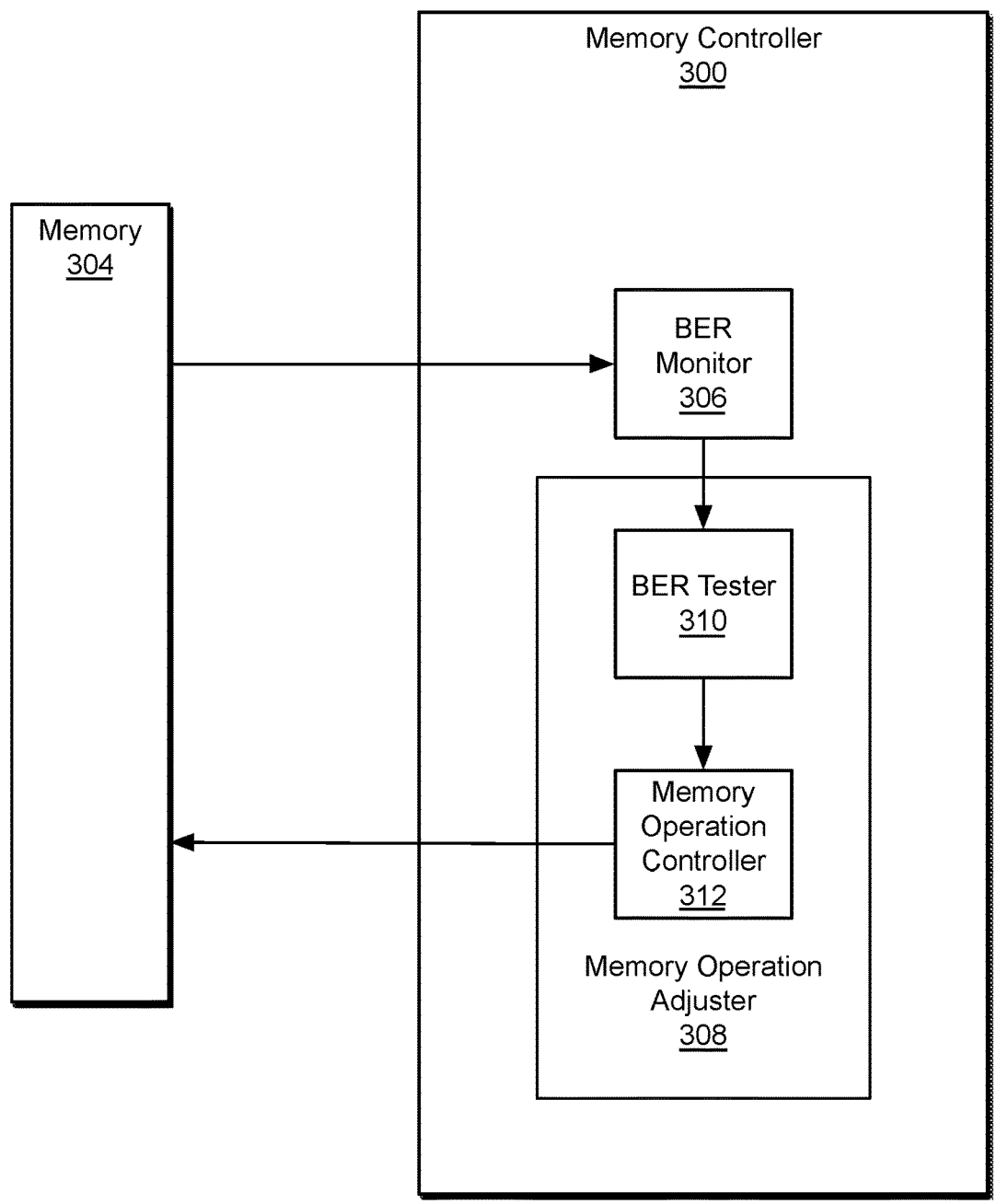
FIG. 3 illustrates selected example components of a memory controller of a memory system.

FIG. 3 illustrates selected example components of a memory controller 300 of a memory system 302. The memory controller 300 manages the reading and writing of data with a memory 304 and includes a BER monitor 306 and a memory operation adjuster 308, which function in a manner that is at least similar to the corresponding components described with regard to FIG. 2.

In FIG. 3, the memory operation adjuster 308 includes a BER tester 310, which receives the BER monitored by the BER monitor 306, determines an acceptable memory error condition for the current memory context, and determines whether the monitored BER satisfies the acceptable memory error condition. The result of this determination is provided to a memory operation controller 312, which adjusts the operation of the memory system 302 in accordance with the determination (e.g., increasing BER to reduce power consumption when acceptable, decreasing BER when needed to satisfy the acceptable memory error condition for the current memory context). In at least one implementation, the BER monitor 306 is executable (e.g., by a processor, such as a controller or other circuitry) to monitor the BER in data read from the memory 304 in the memory system 302, the BER tester is executable (e.g., by a processor, such as a controller or other circuitry) to determine that the monitored BER satisfies an acceptable memory error condition, and the memory operation controller is executable (e.g., by a processor, such as a controller or other circuitry) to adjust the operation of the memory system 302 to decrease the power consumption of the memory system 302. As such, the adjusted operation results in a new BER monitored from data read from the memory 304 that satisfies the acceptable memory error condition according to the BER tester 310.

In different implementations, the memory operation controller 312 can adjust different aspects of the memory system operation to reduce power consumption. Examples of power consumption-reducing adjustments are listed below:

Reduce a voltage rail (e.g., $V_{DD}$—the core supply, $V_{DDQ}$—the I/O supply) powering the memory 304

Reduce the refresh rate (e.g., as represented by tREFI—the refresh interval or tRFC—the refresh cycle time) applied to the memory 304—the refresh rate refers to the rate at which data in memory cells of the memory 304 are re-written to restore the charge in the memory cells Reduce the interface drive current (e.g., the current driving capability of the memory interface's I/O signals, sometimes referred to as Drive Strength or DS) applied to the memory 304

Change the error correction encoding, encryption, and/or compression schemes—Different error correction encoding, encryption, and compression schemes can yield different BERs, result in different memory access latencies, and/or consume different amounts of power. As such, by changing the error correction encoding scheme, the BER may be reduced, allowing the memory operation controller 312 to perform other power consumption adjustments, such as those listed above, which can contribute to increasing the BER. In one implementation, the memory operation controller 312 can limit the error correction encoding, encryption, and compression schemes to those that satisfy memory access latency requirement and/or other memory access requirements of a given application. Generally, the term "memory access latency" refers to the time (the latency) between initiating a request for data in memory until it is received by the requester (e.g., the application).

Figure 4:
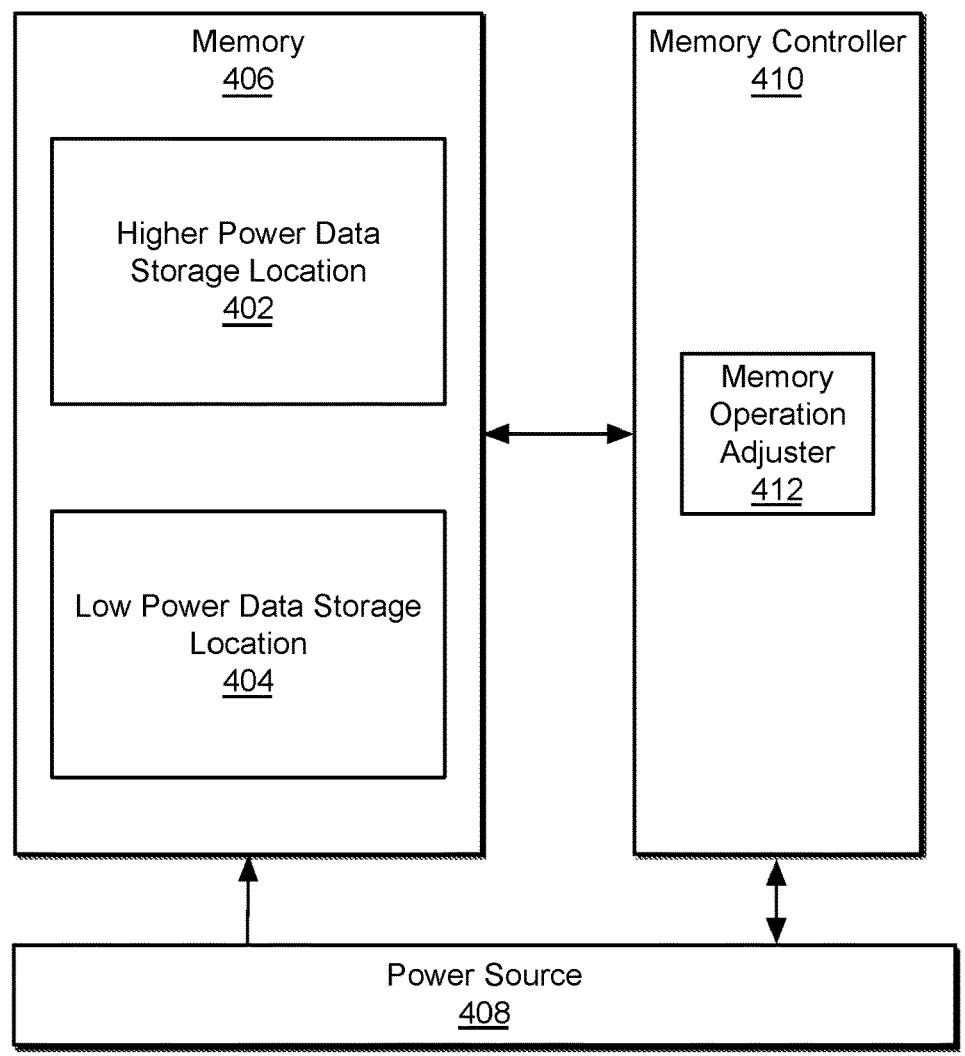
FIG. 4 illustrates example components of a memory system that balances power consumption with an acceptable bit error rate (BER) using a higher power data storage location and a lower power data storage location in a memory.

Switching data access from a higher power data storage location to a lower power data storage location (see the discussion of FIG. 4)

In contrast, the memory operation controller 312 can also adjust operation to decrease the BER, which typically increases the power consumption, such as by increasing the first three operational aspects above, although changing the error correction encoding, encryption, and/or compression schemes may also be employed.

The technology described in FIG. 3 provides one or more technical benefits of multiple operating aspects that can be adjusted to balance power consumption with a BER that satisfies an acceptable memory error condition.

FIG. 4 illustrates example components of a memory system 400 that balances power consumption with an acceptable bit error rate (BER) using a higher power data storage location 402 and a lower power data storage location 404 in a memory 406, which represent different regions within the memory 406. The memory system 400 is supplied power from a power source 408. A memory controller 410 manages the reading and writing of data with the memory 406 and includes, among other components (not shown), a memory operation adjuster 412, which evaluates the BER from the memory 406 in the context of the application accessing the memory 406 and/or physical operating parameters (e.g., temperature, vibration, semiconductor manufacturing process variations) of the memory system 400. Some applications are more BER tolerant than others; some physical operating parameters make the memory more susceptible to BER problems than others. Accordingly, based on one or more of these factors, the memory operation adjuster 412 can adjust the operation of the memory system 400 to increase/decrease the BER, often with a corresponding effect of decreasing/increasing the power consumption of the memory system 400.

In the example illustrated in FIG. 4, the memory operation adjuster 412 can adjust the operation of the memory 406 to access (e.g., store and/or read) data from the higher power data storage location 402 or the lower power data storage location 404. For example, the higher power data storage location 402 may have a faster refresh rate, a higher supply voltage, a higher interface drive current, and/or other power consumption-increasing operational aspects, and the lower power data storage location 404 may have a slower refresh rate, a lower supply voltage, a lower interface drive current, and/or other power consumption decreasing operational aspects. Accordingly, for a given application, the memory operation adjuster 412 can direct data accesses to one or the other storage location depending on the acceptable memory error condition of the accessing application and power consumption objectives.

It should be understood that more or less than two power-varied storage locations may be employed in various implementations. In implementations with multiple power-varied storage locations, the memory operation adjuster 412 can re-direct data accesses to the appropriate power-varied storage location depending on the acceptable memory error condition of the accessing application and power consumption objectives. The memory operation adjuster 412 can also adjust specific memory operational parameters (e.g., refresh rate, supply voltage) of the different power-varied storage locations. The technology described in FIG. 4 provides one or more technical benefits of yet another operating aspect that can be adjusted to balance power consumption with a BER that satisfies an acceptable memory error condition.

Figure 5:
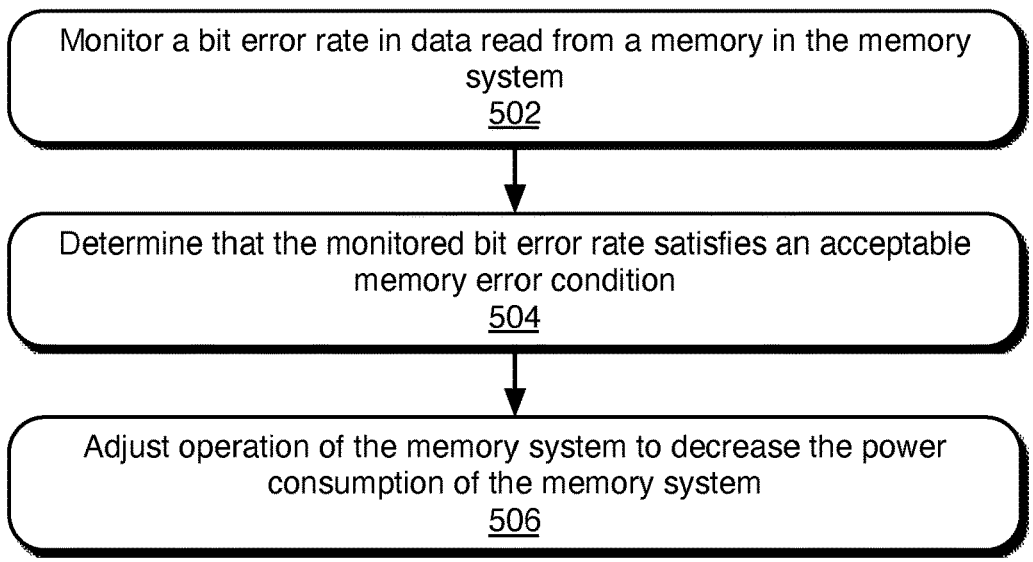
FIG. 5 illustrates example operations for adjusting memory operation in a memory system to decrease power consumption by the memory system.

FIG. 5 illustrates example operations 500 for adjusting memory operation in a memory system to decrease power consumption by the memory system. A monitoring operation 502 monitors a bit error rate in data read from a memory in the memory system. A determining operation 504 determines that the monitored bit error rate satisfies an acceptable memory error condition. For example, the acceptable memory error condition may correspond to the application currently accessing the memory and/or the current physical operating parameters (e.g., temperature, vibration, semiconductor manufacturing process variations). The acceptable memory error condition may be determined from a database accessible by a memory operation adjuster in a memory controller and/or in cooperation with the application and/or operating system of the computing device. For example, the application may specify (e.g., in a configuration datastore) that it requires a minimum BER for its acceptable performance. A user may also influence the acceptable memory error condition through a configuration file or user interface presented through a display.

An adjusting operation 506 adjusts operation of the memory system to increase the BER and to decrease the power consumption of the memory system. Typically, decreasing the power consumption of the memory system also increases the BER. However, the adjusting operation 506 adjusts the memory system operation in such a way as to increase the BER monitored from data read from the memory so that the monitored BER still satisfies the acceptable memory error condition. The technology described in FIG. 5 provides one or more technical benefits of allowing a computing system to adjust the operation of a memory system to reduce power consumption while satisfying an acceptable memory error condition. Accordingly, the memory system can initially move to a lower power consumption mode without impairing memory access operations of a given application and/or under specific physical operating parameters.

Figure 6:
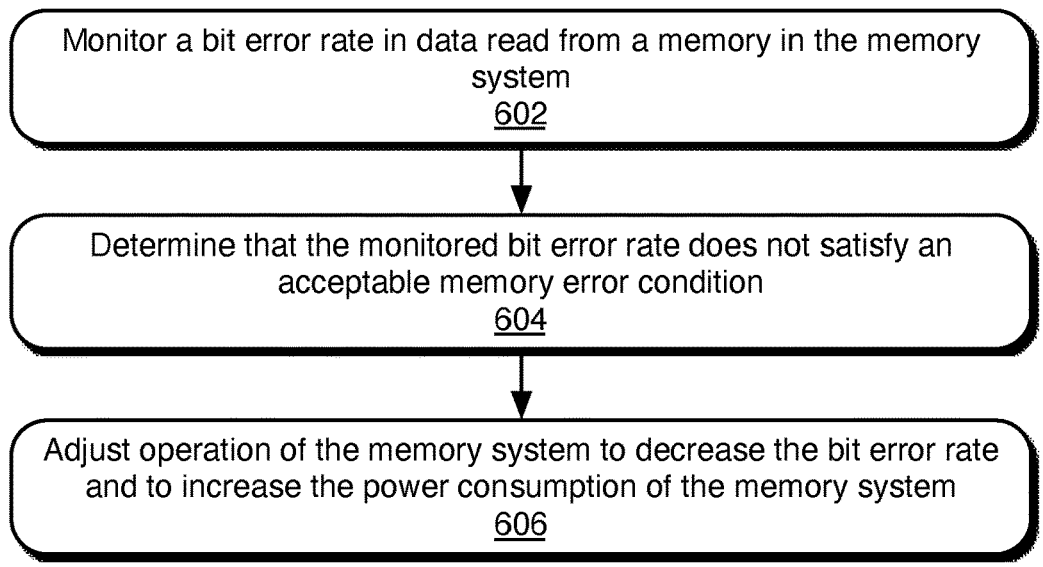
FIG. 6 illustrates example operations for adjusting memory operation in a memory system to decrease BER in the memory system.

FIG. 6 illustrates example operations 600 for adjusting memory operation in a memory system to decrease BER in the memory system. In some implementations, the BER has been increased to a level that does not satisfy an acceptable memory error condition of a subsequent application and/or physical operating parameter (e.g., a different application accesses the memory, temperature of the computing device changes over time). In such cases, a memory controller may adjust memory operation to decrease the BER, even at the cost of increased power consumption.

A monitoring operation 602 monitors a bit error rate in data read from a memory in the memory system. A determining operation 604 determines that the monitored bit error rate satisfies an acceptable memory error condition. For example, the acceptable memory error condition may correspond to the application currently accessing the memory and/or the current physical operating parameters (e.g., temperature, vibration, semiconductor manufacturing process variations). The acceptable memory error condition may be determined from a database accessible by a memory operation adjuster in a memory controller and/or in cooperation with the application and/or operating system of the computing device. For example, the application may specify (e.g., in a configuration datastore) that it requires a minimum BER for its acceptable performance.

An adjusting operation 606 adjusts operation of the memory system to decrease the BER and to increase the power consumption of the memory system. Typically, increasing the power consumption of the memory system also decreases the BER. As such, the adjusting operation 606 adjusts the memory system operation in such a way as to decrease the BER monitored from data read from the memory such that the monitored BER satisfies the acceptable memory error condition.

The technology described in FIG. 6 provides one or more technical benefits of allowing a computing system to re-adjust the operation of a memory system to return or to move to an acceptable memory error condition. Accordingly, the memory system can initially move to a lower power consumption mode and then increase power consumption just enough to satisfy an acceptable memory error condition at a later time.

Figure 7:
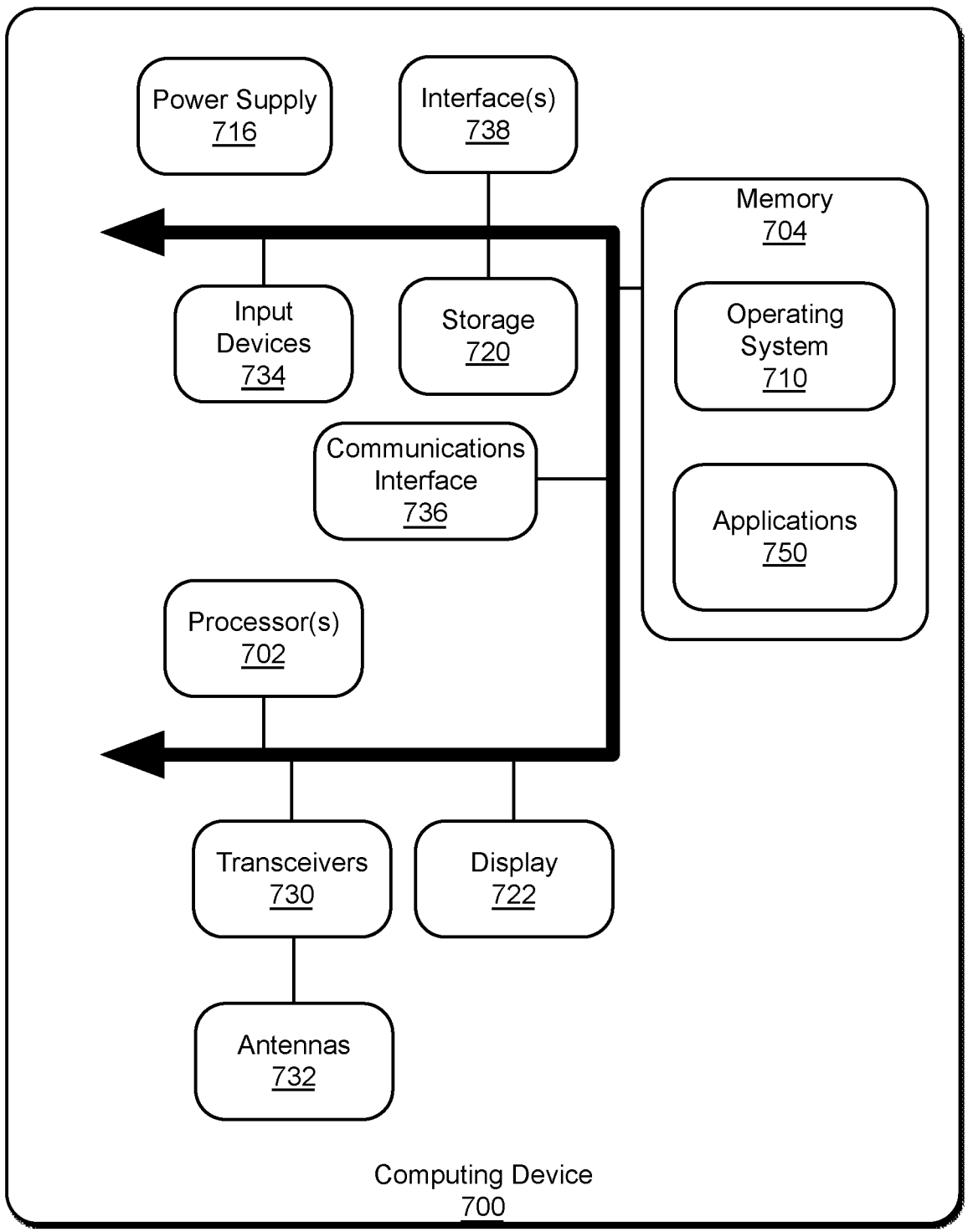
FIG. 7 illustrates an example computing device for implementing the features and operations of the described technology.

FIG. 7 illustrates an example computing device 700 for implementing the features and operations of the described technology. The computing device 700 may embody a remote-control device or a physical controlled device and is an example network-connected and/or network-capable device and may be a client device, such as a laptop, mobile device, desktop, tablet; a server/cloud device; an internet-of-things device; an electronic accessory; or another electronic device. The computing device 700 includes one or more processor(s) 702 and a memory 704. The memory 704 generally includes both volatile memory (e.g., RAM) and nonvolatile memory (e.g., flash memory). An operating system 710 resides in the memory 704 and is executed by the processor(s) 702.

In an example computing device 700, as shown in FIG. 7, one or more modules or segments, such as applications 750, an error correction encoder, an error correction decoder, a BER monitor, a memory operation adjuster, a BER tester, a memory operation controller, compression and decompression elements, encryption and decryption elements, and other modules are loaded into the operating system 710 on the memory 704 and/or storage 720 and executed by processor(s) 702. The storage 720 may include one or more tangible storage media devices and may store one or more acceptable memory error conditions, BER levels, physical operating parameters, cryptographic keys (e.g., for encryption/decryption), or other data. The storage 720 may be local to the computing device 700 or may be remote and communicatively connected to the computing device 700.

The computing device 700 includes a power supply 716, which is powered by one or more batteries or other power sources, and which provides power to other components of the computing device 700. The power supply 716 may also be connected to an external power source that overrides or recharges the built-in batteries or other power sources.

The computing device 700 may include one or more communication transceivers 730, which may be connected to one or more antenna(s) 732 to provide network connectivity (e.g., mobile phone network, Wi-Fi®, Bluetooth®) to one or more other servers and/or client devices (e.g., mobile devices, desktop computers, or laptop computers). The computing device 700 may further include a communications interface 736 (e.g., a network adapter), which is a type of computing device. The computing device 700 may use the communications interface 736 and any other types of computing devices for establishing connections over a wide-area network (WAN) or local-area network (LAN). It should be appreciated that the network connections shown are examples and that other computing devices and means for establishing a communications link between the computing device 700 and other devices may be used.

The computing device 700 may include one or more input devices 734 such that a user may enter commands and information (e.g., a keyboard or mouse). These and other input devices may be coupled to the server by one or more interfaces 738, such as a serial port interface, parallel port, or universal serial bus (USB). The computing device 700 may further include a display 722, such as a touch screen display.

The computing device 700 may include a variety of tangible processor-readable storage media and intangible processor-readable communication signals. Tangible processor-readable storage can be embodied by any available media that can be accessed by the computing device 700 and includes both volatile and nonvolatile storage media, removable and non-removable storage media. Tangible processor-readable storage media excludes communications signals (e.g., signals per se) and includes volatile and nonvolatile, removable and non-removable storage media implemented in any method or technology for storage of information such as processor-readable instructions, data structures, program modules, or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage, or other magnetic storage devices, or any other tangible medium which can be used to store the desired information and which can be accessed by the computing device 700. In contrast to tangible processor-readable storage media, intangible processor-readable communication signals may embody processor-readable instructions, data structures, program modules, or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Various software components described herein are executable by one or more processors, which may include logic machines configured to execute hardware or firmware instructions. For example, the processors may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Aspects of processors and storage may be integrated together into one or more hardware logic components. Such hardware-logic components may include field-programmable gate arrays (FPGAs), program- and application-specific integrated circuits (PASIC/ASICs), program-specific and application-specific standard products (PSSP/ASSPs), system-on-a-chip (SOC), and complex programmable logic devices (CPLDs), for example.

The terms "module," "program," and "engine" may be used to describe an aspect of a remote-control device and/or a physically controlled device implemented to perform a particular function. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

It will be appreciated that a "service," as used herein, is an application program executable across one or multiple user sessions. A service may be available to one or more system components, programs, and/or other services. In some implementations, a service may run on one or more server computing devices.

While this specification contains many specific implementation details, these should not be construed as limitations on the scope of any technologies or of what may be claimed but rather as descriptions of features specific to particular implementations of the particular described technology. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can, in some cases, be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order or that all illustrated operations be performed to achieve desirable results. Furthermore, it should be understood that logical operations may be performed in any order, adding or omitting operations as desired, regardless of whether operations are labeled or identified as optional, unless explicitly claimed otherwise or a specific order is inherently necessitated by the claim language. In some cases, the actions recited in the claims can be performed in a different order and still achieve desirable results. In certain circumstances, multitasking and parallel processing may be advantageous. The logical operations making up implementations of the technology described herein may be referred to variously as operations, steps, objects, or modules.

Moreover, the separation of various system components in the implementations described above should not be understood as requiring such separation in all implementations, and it should be understood that the described program components and systems can generally be integrated together into a single software product or packaged into multiple software products. Thus, particular implementations of the subject matter have been described. Other implementations are within the scope of the following claims. Nevertheless, it will be understood that various modifications can be made without departing from the spirit and scope of the recited claims.

Clause 1. A method of adjusting power consumption in a memory system, the method comprising: monitoring a bit error rate in data read from a memory in the memory system; determining that the monitored bit error rate satisfies an acceptable memory error condition; and adjusting operation of the memory system to decrease the power consumption of the memory system, wherein the adjusted operation results in a new bit error rate monitored from data read from the memory that satisfies the acceptable memory error condition.

Clause 2. The method of clause 1, wherein the memory system is powered by a supply voltage, and the adjusting operation comprises: adjusting the supply voltage supplied to the memory system.

Clause 3. The method of clause 1, wherein memory cells of the memory system are re-written at a refresh rate, and the adjusting operation comprises: adjusting the refresh rate of the memory system.

Clause 4. The method of clause 1, wherein the memory system is supplied with an interface drive current, and the adjusting operation comprises: adjusting the interface drive current supplied to the memory system.

Clause 5. The method of clause 1, wherein data stored in memory cells of the memory system are encoded according to an error correction encoding scheme, and the adjusting operation comprises: changing the data stored in the memory cells to be encoded according to a different error correction encoding scheme.

Clause 6. The method of clause 1, wherein the memory system is accessible by multiple applications and the acceptable memory error condition is dependent at least in part upon which application is accessing the memory system.

Clause 7. The method of clause 1, wherein the acceptable memory error condition is dependent at least in part upon one or more physical operating parameters of the memory system.

Clause 8. A memory system comprising: a bit error rate monitor configured to monitor a bit error rate in data read from a memory in the memory system; a bit error rate tester configured to determine that the monitored bit error rate satisfies an acceptable memory error condition; and a memory operation controller configured to adjust operation of the memory system to decrease power consumption of the memory system, wherein the adjusted operation results in a new bit error rate monitored from data read from the memory that satisfies the acceptable memory error condition according to the bit error rate tester.

Clause 9. The memory system of clause 8, wherein the memory system is powered by a supply voltage, and the memory operation controller is configured to adjust operation of the memory system by adjusting the supply voltage supplied to the memory system.

Clause 10. The memory system of clause 8, wherein memory cells of the memory system are re-written at a refresh rate, and the memory operation controller is configured to adjust the refresh rate of the memory system.

Clause 11. The memory system of clause 8, wherein the memory system is supplied with an interface drive current, and the memory operation controller is configured to adjust the interface drive current supplied to the memory system.

Clause 12. The memory system of clause 8, wherein data stored in memory cells of the memory system are encoded according to an error correction encoding scheme, and the memory operation controller is configured to change the data stored in the memory cells to be encoded according to a different error correction encoding scheme.

Clause 13. The memory system of clause 8, wherein the memory system is accessible by multiple applications and the acceptable memory error condition is dependent at least in part upon which application is accessing the memory system.

Clause 14. The memory system of clause 8, wherein the memory system includes a higher-power data storage location and a lower-power data storage location, and the memory operation controller is configured to increase the bit error rate of the memory system by adjusting operation of the memory system to store data in the lower-power data storage location.

Clause 15. One or more tangible processor-readable storage media devices encoding processor-executable instructions for executing on an electronic computing device a process of adjusting power consumption in a memory system, the process comprising: monitoring a bit error rate in data read from a memory in the memory system; determining that the monitored bit error rate satisfies an acceptable memory error condition; adjusting operation of the memory system to decrease the power consumption of the memory system, wherein the adjusted operation results in a new bit error rate from data read from the memory system; re-monitoring the new bit error rate in data read from a memory in the memory system, responsive to the adjusting operation; and confirming that the monitored new bit error rate satisfies the acceptable memory error condition, responsive to the re-monitoring operation.

Clause 16. The one or more tangible processor-readable storage media devices of clause 15, wherein the memory system is powered by a supply voltage and an interface drive current, and the adjusting operation comprises: adjusting the supply voltage or the interface drive current supplied to the memory system.

Clause 17. The one or more tangible processor-readable storage media devices of clause 15, wherein memory cells of the memory system are re-written at a refresh rate, and the adjusting operation comprises: adjusting the refresh rate of the memory system.

Clause 18. The one or more tangible processor-readable storage media devices of clause 15, wherein data stored in memory cells of the memory system are encoded according to an error correction encoding scheme, and the adjusting operation comprises: changing the data stored in the memory cells to be encoded according to a different error correction encoding scheme.

Clause 19. The one or more tangible processor-readable storage media devices of clause 15, wherein the memory system is accessible by multiple applications and the acceptable memory error condition is dependent at least in part upon which application is accessing the memory system.

Clause 20. The one or more tangible processor-readable storage media devices of clause 15, wherein the acceptable memory error condition is dependent at least in part upon one or more physical operating parameters of the memory system.

Clause 21. A system for adjusting power consumption in a memory system, the system comprising: means for monitoring a bit error rate in data read from a memory in the memory system; means for determining that the monitored bit error rate satisfies an acceptable memory error condition; and means for adjusting operation of the memory system to decrease the power consumption of the memory system, wherein the means for adjusted operation yields a new bit error rate monitored from data read from the memory that satisfies the acceptable memory error condition.

Clause 22. The system of clause 21, wherein the memory system is powered by a supply voltage, and the means for adjusting comprises: means for adjusting the supply voltage supplied to the memory system.

Clause 23. The system of clause 21, wherein memory cells of the memory system are re-written at a refresh rate, and the means for adjusting comprises: means for adjusting the refresh rate of the memory system.

Clause 24. The system of clause 21, wherein the memory system is supplied with an interface drive current, and the means for adjusting comprises: means for adjusting the interface drive current supplied to the memory system.

Clause 25. The system of clause 21, wherein data stored in memory cells of the memory system are encoded according to an error correction encoding scheme, and the means for adjusting comprises: means for changing the data stored in the memory cells to be encoded according to a different error correction encoding scheme.

Clause 26. The system of clause 21, wherein the memory system is accessible by multiple applications and the acceptable memory error condition is dependent at least in part upon which application is accessing the memory system.

Clause 27. The system of clause 21, wherein the acceptable memory error condition is dependent at least in part upon one or more physical operating parameters of the memory system.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

What is claimed is:

1. A method of adjusting power consumption in a memory system, the method comprising:
    monitoring a bit error rate in data read from a memory in the memory system by an application accessing the memory system, wherein the application is executable by a hardware processor;
    determining that the monitored bit error rate satisfies an acceptable memory error condition for the application, wherein the acceptable memory error condition is dependent at least in part upon the application accessing the memory system; and
    adjusting operation of the memory system to decrease the power consumption of the memory system, wherein the adjusted operation results in a new bit error rate monitored from data read from the memory that satisfies the acceptable memory error condition.

2. The method of claim 1, wherein the memory system is powered by a supply voltage, and the adjusting operation comprises:
    adjusting the supply voltage supplied to the memory system.

3. The method of claim 1, wherein memory cells of the memory system are re-written at a refresh rate, and the adjusting operation comprises:
    adjusting the refresh rate of the memory system.

4. The method of claim 1, wherein the memory system is supplied with an interface drive current, and the adjusting operation comprises:
    adjusting the interface drive current supplied to the memory system.

5. The method of claim 1, wherein data stored in memory cells of the memory system are encoded according to an error correction encoding scheme, and the adjusting operation comprises:
    changing the data stored in the memory cells to be encoded according to a different error correction encoding scheme.

6. The method of claim 1, wherein the acceptable memory error condition is dependent at least in part upon one or more physical operating parameters of the memory system.

7. A memory system comprising:
    a bit error rate monitor configured to monitor a bit error rate in data read from a memory in the memory system by an application accessing the memory system, wherein the application is executable by a hardware processor;
    a bit error rate tester configured to determine that the monitored bit error rate satisfies an acceptable memory error condition for the application, wherein the acceptable memory error condition is dependent at least in part upon the application accessing the memory system; and
    a memory operation controller configured to adjust operation of the memory system to decrease power consumption of the memory system, wherein the adjusted operation results in a new bit error rate monitored from data read from the memory that satisfies the acceptable memory error condition according to the bit error rate tester.

8. The memory system of claim 7, wherein the memory system is powered by a supply voltage, and the memory operation controller is configured to adjust operation of the memory system by adjusting the supply voltage supplied to the memory system.

9. The memory system of claim 7, wherein memory cells of the memory system are re-written at a refresh rate, and the memory operation controller is configured to adjust the refresh rate of the memory system.

10. The memory system of claim 7, wherein the memory system is supplied with an interface drive current, and the memory operation controller is configured to adjust the interface drive current supplied to the memory system.

11. The memory system of claim 7, wherein data stored in memory cells of the memory system are encoded according to an error correction encoding scheme, and the memory operation controller is configured to change the data stored in the memory cells to be encoded according to a different error correction encoding scheme.

12. The memory system of claim 7, wherein the memory system includes a higher-power data storage location and a lower-power data storage location, and the memory operation controller is configured to increase the bit error rate of the memory system by adjusting operation of the memory system to store data in the lower-power data storage location.

13. One or more tangible processor-readable storage media devices encoding processor-executable instructions for executing on an electronic computing device a process of adjusting power consumption in a memory system, the process comprising:
  monitoring a bit error rate in data read from a memory in the memory system by an application accessing the memory system, wherein the application is executable by a hardware processor;
  determining that the monitored bit error rate satisfies an acceptable memory error condition for the application, wherein the acceptable memory error condition is dependent at least in part upon the application accessing the memory system;
  adjusting operation of the memory system to decrease the power consumption of the memory system, wherein the adjusted operation results in a new bit error rate from data read from the memory system;
  re-monitoring the new bit error rate in data read from a memory in the memory system, responsive to the adjusting operation; and
  confirming that the monitored new bit error rate satisfies the acceptable memory error condition, responsive to the re-monitoring operation.

14. The one or more tangible processor-readable storage media devices of claim 13, wherein the memory system is powered by a supply voltage and an interface drive current, and the adjusting operation comprises:
  adjusting the supply voltage or the interface drive current supplied to the memory system.

15. The one or more tangible processor-readable storage media devices of claim 13, wherein memory cells of the memory system are re-written at a refresh rate, and the adjusting operation comprises:
  adjusting the refresh rate of the memory system.

16. The one or more tangible processor-readable storage media devices of claim 13, wherein data stored in memory cells of the memory system are encoded according to an error correction encoding scheme, and the adjusting operation comprises:
  changing the data stored in the memory cells to be encoded according to a different error correction encoding scheme.

17. The one or more tangible processor-readable storage media devices of claim 13, wherein the memory system is accessible by multiple applications including the application.

18. The one or more tangible processor-readable storage media devices of claim 13, wherein the acceptable memory error condition is dependent at least in part upon one or more physical operating parameters of the memory system.

19. The method of claim 1, wherein adjusting operation of the memory system to decrease the power consumption of the memory system is further based on determining that the monitored bit error rate is below a buffer amount from a maximum bit error rate specified in the acceptable memory condition.

20. The method of claim 1, wherein adjusting operation of the memory system to decrease the power consumption of the memory system comprises selecting a memory operation adjustment from a set of memory operation adjustments.

* * * * *